(12) United States Patent
Almholt (10) Patent No.: US 11,082,042 B2
(45) Date of Patent: *Aug. 3, 2021

(54) MATERIAL-DISCERNMENT PROXIMITY SENSOR

(71) Applicant: TEXAS INSTRUMENTS INCORPORATED, Dallas, TX (US)

(72) Inventor: Thomas Almholt, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/855,040

(22) Filed: Apr. 22, 2020

(65) Prior Publication Data

US 2020/0321961 A1 Oct. 8, 2020

Related U.S. Application Data

(63) Continuation of application No. 15/041,729, filed on Feb. 11, 2016, now Pat. No. 10,644,697.

(51) Int. Cl.
*H03K 17/955* (2006.01)
*H03K 17/95* (2006.01)
*G06F 3/044* (2006.01)
*G06F 3/046* (2006.01)

(52) U.S. Cl.
CPC ....... *H03K 17/955* (2013.01); *H03K 17/9535* (2013.01); *G06F 3/046* (2013.01); *G06F 3/0445* (2019.05); *H03K 2217/94036* (2013.01); *H03K 2217/96075* (2013.01)

(58) Field of Classification Search
CPC .......... G06F 3/044; G06F 2203/04108; G06F 3/046; G06F 3/0445; H03K 17/955; H03K 17/9535; H03K 2217/94036; H03K 2217/96075

See application file for complete search history.

(56) References Cited

U.S. PATENT DOCUMENTS

| | | |
|---|---|---|
| 9,201,548 B2 | 12/2015 | Leek |
| 9,214,269 B2 | 12/2015 | Samala et al. |
| 9,575,014 B2 | 2/2017 | Leek et al. |
| 9,599,739 B2 | 3/2017 | Leek et al. |

(Continued)

*Primary Examiner* — Temesghen Ghebretinsae
*Assistant Examiner* — Ivelisse Martinez Quiles
(74) *Attorney, Agent, or Firm* — Brian D. Graham; Charles A. Brill; Frank D. Cimino (57) ABSTRACT

A material-discerning sensing device includes an antenna, a capacitive proximity sensor, and a control circuit. The antenna includes multiple conductive loops and is configured to radiate a wireless signal. The antenna defines an interior region devoid of the conductive loops and an exterior region outside the conductive loops. The capacitive proximity sensor includes a conductive pattern provided within the interior region or within a projection of the interior region, as well as a conductive bar. The control circuit is configured to detect a change in a characteristic of an electrical signal from the capacitive sensor. The conductive pattern includes a longitudinal portion, a first plurality of parallel conductors extending away from the longitudinal portion in a first direction and orthogonal to the longitudinal portion, and a second plurality of parallel conductors extending away from the longitudinal portion in a second direction opposite the first direction.

20 Claims, 7 Drawing Sheets

(56) References Cited

U.S. PATENT DOCUMENTS

| | | |
|---|---|---|
| 10,474,307 B2 | 11/2019 | Leek |
| 10,644,697 B2 * | 5/2020 | Almholt ............... H03K 17/955 |
| 2006/0022787 A1 | 2/2006 | Brennan et al. |
| 2006/0049481 A1 | 3/2006 | Tiemeijer et al. |
| 2006/0163692 A1 | 7/2006 | Detecheverry et al. |
| 2011/0012793 A1 | 1/2011 | Amm et al. |
| 2012/0262414 A1 * | 10/2012 | Lai ........................ G06F 3/044 |
| | | 345/174 |
| 2013/0293244 A1 * | 11/2013 | Leek ...................... G06F 3/044 |
| | | 324/630 |
| 2015/0062054 A1 * | 3/2015 | Yun ...................... G06F 3/0412 |
| | | 345/174 |
| 2015/0193080 A1 | 7/2015 | Takahashi et al. |
| 2015/0199042 A1 | 7/2015 | Standing et al. |
| 2016/0162093 A1 | 6/2016 | Kim et al. |

* cited by examiner

MATERIAL-DISCERNMENT PROXIMITY SENSOR

CROSS-REFERENCE TO RELATED APPLICATIONS

This application is a continuation of U.S. patent application Ser. No. 15/041,729, filed Feb. 11, 2016, which is incorporated by reference herein in its entirety.

BACKGROUND

At least some proximity sensing techniques determine whether an object has entered into a range of a proximity sensor as well as an estimate of the distance to the object. For example, a capacitive electrode may be able to discern the proximal presence of an object. A variety of actions may be performed in response to detecting the object and determining the distance between the sensor and the object. However, some proximity sensors may be unable to determine the nature of the proximal object and/or the material(s) that comprise the object. As such, such sensors cannot differentiate between different types of proximate objects (e.g., human finger, metal object, etc.). Accordingly, false positive proximal detections may occur for certain objects that enter the range of the proximity sensor.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections.

Some proximity sensors include a capacitive plate within an antenna coil. Such sensors can detect objects (referred to herein as "proximate objects)) located near the capacitive plate and even discern the type of material comprising the proximate object. However, the range over which the sensor can correctly detect an object and discern its composition is relatively limited. The relatively small range of such sensors is caused by eddy currents generated in the capacitive plate. In accordance with various embodiments, a material-discerning proximity sensor is provided that includes a capacitive sensor that has a particular conductive pattern instead of a capacitive plate. The conductive pattern is such that eddy currents are not readily generated. As a result, the range of the sensor is greatly increased.

Figure 1:
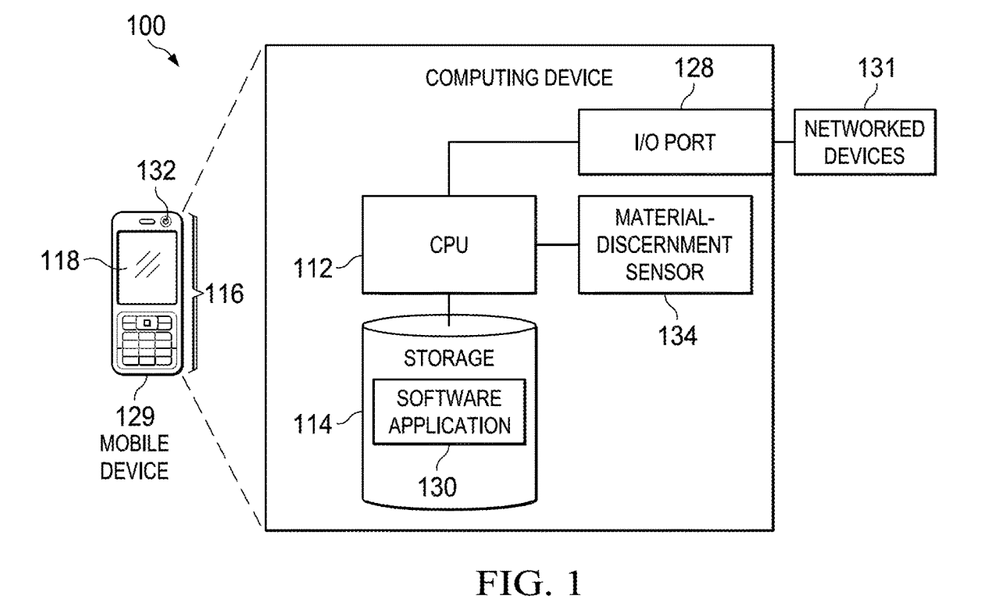
FIG. 1 shows an illustrative computing device containing a material-discernment sensor in accordance with various embodiments.

FIG. 1 shows an illustrative computing device 100 in accordance with various embodiments. For example, the computing device 100 may be, or is incorporated into, a mobile communication device 129, such as a mobile phone, a personal digital assistant, a personal computer, tablet computer, automotive electronics, projection (and/or media-playback) unit, or any other type of electronic system.

In some embodiments the computing device 100 comprises a megacell or a system-on-chip (SoC) which includes control logic such as a central processing unit (CPU) 112 and a storage device 114. The CPU 112 can be any suitable type of processor such as a CISC-type (Complex Instruction Set Computer) CPU, RISC-type CPU (Reduced Instruction Set Computer), a digital signal processor (DSP), etc. The storage device 114 may comprise volatile storage (e.g., random access memory), non-volatile storage such as magnetic storage (e.g., hard disk drive), solid state storage (e.g., read only memory, flash storage, etc.), or optical storage (e.g., compact disc). In some embodiments, storage device 114 may be integrated into CPU 112, while in other embodiments, storage device 114 may be a storage device that is separate from CPU 112. The storage device 114 may store one or more software applications 130 (e.g., embedded applications) which, when executed by the CPU 112, perform any suitable function associated with the computing device 100. The CPU 112 may include (or be coupled to) a material-discernment proximity sensor 134, which includes various components as disclosed herein.

The CPU 112 comprises memory and logic that store information frequently accessed from the storage 114. The computing device 100 may be controlled by a user through a user interface (UI) 116, which provides output and receives input from the user during the execution of the software application 130. The output is provided using the display 118, indicator lights, a speaker, vibrations, image projector 132, and the like. The input is received using audio and/or video inputs (using, for example, voice or image recognition), and hard and/or soft buttons. The material-discernment proximity sensor 134 also may provide a signal as an input to the CPU 112. In some embodiments, the signal from the material-discernment proximity sensor 134 may indicate the type of foreign object in the vicinity of the material-discernment proximity sensor 134. In other embodiments, the material-discernment proximity sensor 134 provides a signal to the CPU 112 and the CPU 112 determines the type of foreign object based on the signal.

The CPU 112 is coupled to one or more input/output (I/O) ports 128 which provide an interface for the computing device 100. The I/O port 128 may be configured to receive input from and/or provide output to peripherals and/or networked devices 131, including tangible media (such as flash memory) and/or cabled or wireless media. These and other input and output devices are selectively coupled to the computing device 100 by external devices using wireless (e.g., WiFi, cellular, Bluetooth, etc.) or cabled connections.

As disclosed herein, material-discerning sensing techniques allow an autonomous electronic system to more accurately determine the substance of a proximal object by evaluating characteristics of materials that are included by the proximal object. Discernment of the characteristics of materials included by the proximal object is used to reduce (and/or eliminate) problems that are associated with false positive proximal detections.

Figure 2:
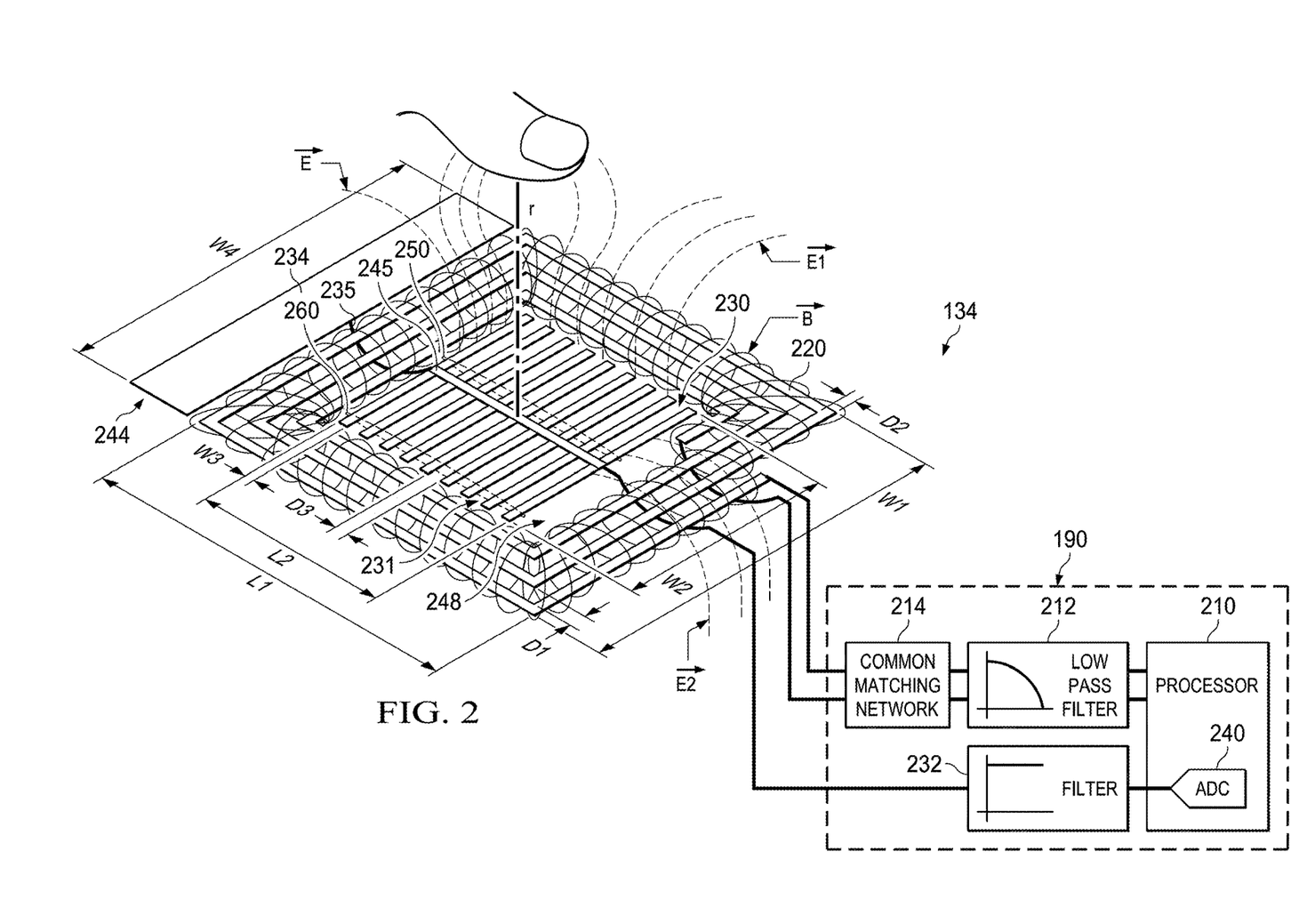
FIG. 2 is a schematic diagram illustrating a material-discerning proximity sensing system in accordance with various embodiments

FIG. 2 is a schematic diagram illustrating an example of the material-discerning proximity sensor 134. In the example of FIG. 2, the material-discerning proximity sensor 134 includes a control circuit 190 which includes a processor 210, a low pass filter 212, a common matching network 214, an antenna 220, a capacitive sensor 230, a filter 232, and an analog-to-digital converter (ADC) 240. The ADC 240 may be part of, or separate from, the processor 210. In some embodiments, processor 210 is separate from CPU 112 and in other embodiments, processor 210 is CPU 112. In some embodiments, the components shown in FIG. 2 may be part of the material-discerning proximity sensor, while in other embodiments, some, but not all, of the components comprise the sensor.

Processor 210 is configured to control functions of material-discerning proximity sensor 134 in response to the closeness of a proximal object, such as a human finger, metal object, etc. Processor 210 generates and/or controls a radio-frequency (RF) signal that can drive antenna 220. The RF signal is a repetitive wave signal, which can be a sine wave, a square wave, or other waveforms suitable for driving antenna 220. In some embodiments, a square wave signal is generated by processor 210 and filtered by low pass filter 212 to pass a fundamental frequency (at a frequency such as 13.56 megahertz). Common matching network 214 is configured to balance the impedance of the feed lines to the antenna 220 with the characteristic impedance of the antenna 220 itself.

In the embodiment illustrated in FIG. 2, antenna 220 is implemented as a coil wherein the antenna, when energized, has an electrical core that extends through a portion of the capacitive sensor 230. Antennal 220 may also be referred to as an inductor or an antenna coil. The coil of antenna 220 can be arranged as, for example, a series of conductive traces that progressively wind or loop (one or more times) around an inner portion of the capacitive sensor 230. In such embodiments, the conductive traces are referred to as loops. When the conductive loops are arranged in a rectilinear fashion, each segment (or group of segments) is shorter (or longer, depending on a direction in which the segments are traversed) such that the segments progressively "spiral" inwards to (or outwards from, depending on the direction in which the segments are traversed) the capacitive proximity sensor 230. In an alternate embodiment, the conductive traces also can be arranged using curved traces to form a curved spiral that is wound around the capacitive sensor 230.

In the example of FIG. 2, the capacitive sensor 230 is formed as a conductive pattern 231 coupled to a conductive bar 234. The conductive bar 234 is electrically coupled to the conductive pattern 231 of the capacitive sensor 230 via conductive connection 235. The antenna 220 defines an interior region 248 which is devoid of any of the conductive loops of the antenna 220. The antenna 220 also defines an exterior region 244 outside the plurality of loops. In some embodiments, the conductive pattern 231 of the capacitive sensor 230 (or at least a portion of it) is provided within the interior region 248, and the conductive bar 234 is provided in the exterior region 244. The conductive bar has a width W4 which is substantially the same as the width W1 of the antenna coil 220 in at least some embodiments. In other embodiments, the width W4 of the conductive bar 234 can be substantially different width W1 of the antenna coil 220.

The processor 210 through other components such as the low pass filter 212 and the common matching network 214 couple to opposite ends of the conductive loops of antenna 220 as shown in FIG. 2. The conductive loops of the antenna are arranged to be mutually inductive and form an electric field in response to an applied RF signal generated by or caused to be generated by, for example, processor 210. In some embodiments, an RF signal generator is included to generate the RF signal upon receipt of an initiation signal by the processor 210.

The total length of the conductive loops of antenna 220, the number of turns of the loops, the separation between adjacent loops, and the width and length of each of the loops can be selected in accordance with a predetermined fraction of the wavelength of the RF signal (e.g., tone and/or carrier wave) coupled to the antenna 220. The range "r" is the distance between the capacitive sensor 230 and the proximate object to be detected by the sensor. The range "r" and directionality of the radiated electric field are affected by the shape, proportions, trace width, distance between traces, total inner perimeter of the conductive traces and total outer perimeter of the conductive loops.

The electric field is illustrated in FIG. 2 as field lines $\vec{E}$ in which field lines $\vec{E1}$ are generated in association with a capacitive sensor mode and field lines $\vec{E2}$ are generated in association with an RF/material discernment mode. The field lines $\vec{E1}$ illustrate the electric field coupled between the object to be detected and the associated portions of the capacitive sensor 230 and field lines $\vec{E2}$ illustrate the electric field coupled between the loops of antenna 220 and the associated portions of the capacitive sensor 230. An upper main lobe and a lower main lobe of the electric and magnetic fields can be used to detect the proximate object. The electric field is also associated with magnetic components $\vec{E}$. Both conductive and non-conductive objects may impact the strength of the $\vec{E}$ field of the antenna 220, which is associated with field lines $\vec{E2}$. Thus, in a material discernment mode of operation of the sensor 134, as the $\vec{E}$ field is impacted, the $\vec{E2}$ field thus also is impacted, which causes a change in the amplitude on the associated portions of the capacitive proximity sensor 230 due to the changes, for example, in the $\vec{E2}$ field.

Thus, the antenna 220 is arranged as a coil that, when energized, generates an electrical field having upper lobes and lower lobes, with a main upper lobe and main lower lobe defining an axis that extends through a portion of the surface of the capacitive proximity sensor 230 (as discussed below with respect to FIG. 3). When viewed as an orthogonal projection using an axis of projection (as viewed from above, for example) that is not parallel to a portion of the surface of the capacitive proximity sensor 230, the traces appear to surround the capacitive proximity sensor 230.

For ease of commercialization, the antenna is arranged to radiate a radio-frequency signal and can be driven by a transmit output power below any applicable government regulated threshold (e.g., for a frequency band that includes the frequency of the radio-frequency signal coupled to the antenna 220).

In accordance with various embodiments, the capacitive proximity sensor 230 comprises a conductive pattern 231. In the example of FIG. 2, the pattern includes a longitudinal portion 245 which may extend from one end of the pattern to the opposing end. The longitudinal portion 245 may be formed as elongate conductor (i.e., longer in one direction than in an orthogonal direction). The pattern 231 may have a have length of L2 and the longitudinal portion 245 may be substantially equal to L2. Extending away at, for example, a 90 degree angle (i.e., orthogonal) to the longitudinal portion 245 is a first plurality of parallel conductors 250 and a second plurality of conductors 260. Any number of conductors can be included in the first and second pluralities of parallel conductors 250, 260 (e.g., 10 in each plurality). The first and second pluralities of parallel conductors 250 and 260 may be electrically connected to the longitudinal portion 245 to thereby form one conductive pattern comprising the longitudinal portion 245 and first and second pluralities of parallel conductors 250 and 260. In some embodiments, each conductor of the first and second pluralities of conductors has an electrical connection only to longitudinal portion 245. The second plurality of parallel conductors 260 extend away from the longitudinal portion in a direction generally opposite that of the first plurality of parallel conductors 250. The pattern of the capacitive sensor 230 in the example of FIG. 2 is thus reminiscent of a fish bone pattern. Due to the spacing between adjacent parallel conductors 250, 260 and that the pattern is not a plate, eddy currents are reduced or eliminated. As a result, the range of operation of the sensor 134 is increased. The eddy currents will generate small magnetics fields in the opposite direction of the main magnetic field generated by the outer conductor and this will reduce the overall magnetic field strength of the outer loop effectively reducing the Quality factor of the outer loop inductor and therefore increase the range.

Each of the parallel conductors 250, 260 includes a width which may be common to all of the conductors and shown in FIG. 2 as W3. The spacing between adjacent parallel conductors is designated in FIG. 2 as D3. In some embodiments D3 is substantially equal to W3. In other embodiments, D3 may be larger or smaller than W3. The lengths of the conductors may all have the same length in some embodiments, while in other embodiments some of the conductors may have different lengths than other conductors. The interior region 248 defined by the antenna 220 has a length in the direction defined by L2 and a width in the direction defined by W2. The combined lengths of the conductors 250, 260 are substantially equal to the width of the interior region 248 in at least some embodiments. That is, the conductors 250, 260 extend substantially across the span of the interior region 248. In some embodiments, the length of the longitudinal portion 245 is not the same as the length of the interior region 248. In some embodiments, the length L2 of the longitudinal portion 245 is at least 80% of the length of the interior region 248.

The material comprising the capacitive sensor 230 may include copper. The outer dimensions of the conductive pattern is designated in FIG. 2 as L2 and W2. L2 may be the same as or different than W2. The aspect ratio of the outer dimensions L2 and W2 of capacitive sensor 230 can vary and the area thereof can be larger or smaller than the area of a human finger. The conductive pattern 231 of the capacitive sensor 230 may be formed on a fixed substrate such as a printed circuit board (PCB) or formed on a flexible substrate such as a flexible PCB. As discussed above, in an embodiment coil antenna 220 has dimensions L1 and W1 and is arranged around the perimeter of the capacitive proximity sensor 230. The width of each loop is designated as D2, and the spacing between loops is D1. The magnitude of D1 and D2, as well as the other dimensions listed herein, can be customized for individual applications.

The material-discernment proximity sensor 134 is arranged to discern the proximal presence of an object by detecting a change in capacitance of the capacitive sensor. The material-discernment proximity sensor 134 is also used as a sensor for the discernment of the material comprising the proximal object by sensing the disruption (and the degree of disruption) of the electric field produced by antenna 220. Thus the material-discernment proximity sensor 134 is used to make two differing types of measurements—a first measurement as to whether an object is present and a second measurement as to the composition of the object. In an embodiment, the measurements are time-multiplexed in which the types of measurements are alternated.

System 200 uses the capacitive sensor 230 in conjunction with an electrical quantity sensor such as ADC 240 to measure the level at the applied frequency of the electrical field coupled to the capacitive sensor 230 from the surrounding coil antenna 220. A function of the electrical quantity sensor is to quantify (for example, in units of time, resistance, capacitance, and the like) a detected electrical property that is associated with the capacitive sensor. As various objects move into the field of the antenna, the objects impact and interfere with the tuning and efficiency of the antenna 220 and the common matching network 214 (which can be matched to the antenna 220). Objects in the field that are conductive affect characteristics of the magnetic field (and the concomitant electric field) output by the antenna 220 to a substantially greater degree than non-conductive objects. As such, in at least some embodiments, the material-discernment proximity sensor 134 can differentiate metal from non-metal objects. One characteristic of the characteristics of the electric field that is changed is manifested as a change in amplitude (e.g., voltage and/or current) of the radio-frequency signal used to generate the electric and magnetic fields coupled to the capacitive sensor 230.

The change in amplitude of radio-frequency signal can be detected by using measurements performed by the ADC 240. The ADC 240 forwards the measurements as data to be used by software and/or firmware of the processor 210. Filter 232 may be employed to filter the received radio-frequency signal to prevent and/or reduce aliasing of the sampled radio-frequency signal by the ADC 240.

In an embodiment, a relatively low speed ADC 240 can be used to minimize power consumption, complexity, and layout area, although any speed ADC can be used. With a low-speed ADC implementation, under-sampling and aliasing are intentionally used in a manner that allows for signal energy at the ADC 240 input to be detected while providing increased immunity to noise.

Without external filtering (to maintain a low cost implementation, for example), the amplitude of the radio signal frequency received from the capacitive sensor 230 can still be measured by the ADC 240 regardless of degree of aliasing caused by under-sampling even given a large disparity in sampling rate and Nyquist rates with regard to the frequency of the radio-frequency signal. The capacitive sensor 230 that is under-sampled by the ADC 240 thus effectively may operate using a broadband input.

The total energy determined by the under-sampled ADC 240 input is determined by, for example, summing the magnitude of the samples of the capacitive sensor 230 (as affected by the electric field) over a selected time period (e.g., a tenth of a second) in which to accumulate samples. In an alternate embodiment, a software envelope detector can be arranged to determine the total energy. Thus, an unperturbed electric field, the presence of a non-conductive object within the electric field, and the presence of noise content do not substantially affect the baseline level of energy at the ADC 240 input.

The amplitude of the sampled signal (even without the intervening presence of filter 232) is not substantially incorrectly measured by the ADC 240 when under-sampling the signal from the capacitive sensor 230. The ADC 240 is able to substantially correctly measure the energy coupled to the capacitive sensor 230 because the presence of a proximal conductive object (within range of the electric field) both lowers the energy signal amplitude as determined by accumulating samples over a selected time period at the input of the ADC 240, and also tends to shield the system 200 from external noise sources. Accordingly, under-sampling by the ADC 240 provides for increased noise immunity for the system, while also allowing the use of a relatively simple (e.g., low cost) broadband ADC 240 to measure the capacitive sensor 230.

In other embodiments, more complex ADCs, comparators, sample-and-hold circuits, or other common peripherals or other various types of voltage sensors may be used to detect a change in amplitude of radio-frequency signal coupled to capacitive proximity 230. The detected change in amplitude of the radio-frequency signal coupled to capacitive sensor 230 can be detected by accumulating samples over a selected time period using an electrical quantity sensor.

In an embodiment, a radio-frequency identification (RFID) signal generator can be arranged to couple an RFID signal to the antenna 220 such that the antenna is used to radiate an RFID radio-frequency signal. Using the antenna 220 to radiate the RFID radio-frequency signal allows the system 200 design to be more compact as it obviates the need to have an antenna dedicated solely for radiating the RFID signal. Likewise, the capacitive sensor 230 is arranged to receive the RFID radio-frequency signal. Using the capacitive sensor 230 to receive the RFID radio-frequency signal allows the material-discernment proximity sensor 134 design to be more compact by obviating the need to have a receiving antenna solely dedicated for receiving the RFID radio-frequency signal.

Similarly, the ADC 240 can be configured to sample the RFID radio-frequency signal received by the capacitive sensor and to output and to transmit the samples to the processor 210 to provide an RFID capability for system 200. Using the ADC 240 to sample the RFID radio-frequency signal allows the system 200 design to be more compact by sharing the use of the ADC for reading the RFID radio-frequency signal, reading the received radio-frequency signal, and measuring a capacitance of the capacitive sensor 230, for example. The readings of the received radio-frequency signal, the received RFID radio-frequency signal, and the capacitance of the capacitive sensor can be time-multiplexed when transmitted to the processor 210, for example.

The selected time periods for reading of the received radio-frequency signal, the received RFID radio-frequency signal, and the capacitance of the capacitive sensor can vary in accordance with the selected reading function. For example, the time period for reading the RFID radio-frequency signal can be selected in accordance with the RFID protocols. Likewise, the time period for measuring the capacitance of the capacitive sensor 230 can be selected in accordance with a time interval suitable for determining an RC (resistive-capacitive) time-constant associated with an implementation of the capacitive sensor 230.

Similarly, the time period for readings of the received radio-frequency signal can be selected in accordance with a time interval suitable for determining the movement of a proximal object within the electric field. For a human finger moving within range "r" of a lobe of the magnetic and electric field, a selected time interval for accumulating samples can be selected to determine the velocity of the finger moving through a lobe of the electric field.

Figure 3:
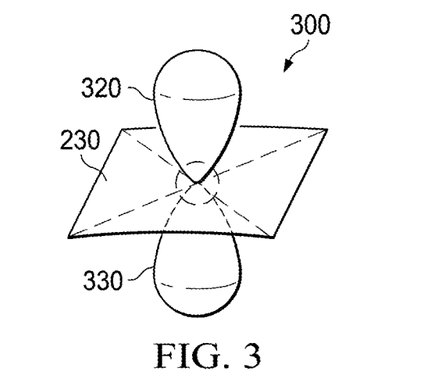
FIG. 3 is a schematic diagram illustrating radiated lobes of a material-discerning proximity sensing sensor in accordance with various embodiments.

FIG. 3 is a schematic diagram illustrating radiated lobes of a material-discerning proximity sensing sensor 134 in accordance with embodiments of the disclosure. As shown in FIG. 2, antenna 220 is arranged as a coil that, when energized, generates an electrical field in response to a radio-frequency signal being coupled the antenna 220. In FIG. 3, the electric field 300 is illustrated as a main "lobe" of the generated having an upper lobe 320 and a lower lobe 330. The upper and lower lobes 320 and 330 define an axis that extends through a portion of the surface of the capacitive sensor 230. The upper lobe 320 and the lower lobe 330 are illustrated as geometric shapes for the sake of simplicity. In various embodiments the shape of the electric field varies in accordance with the various shapes and arrangements of the antenna 220 and the capacitive sensor 230.

Figure 4:
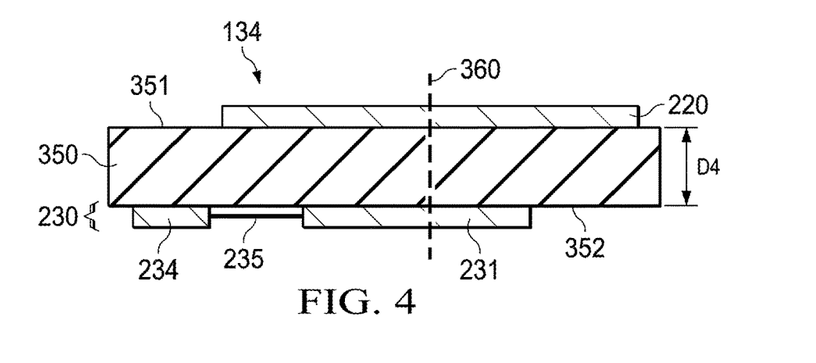
FIG. 4 shows a cross-sectional side view of the material discernment sensor in accordance with various embodiments.
Figure 5:
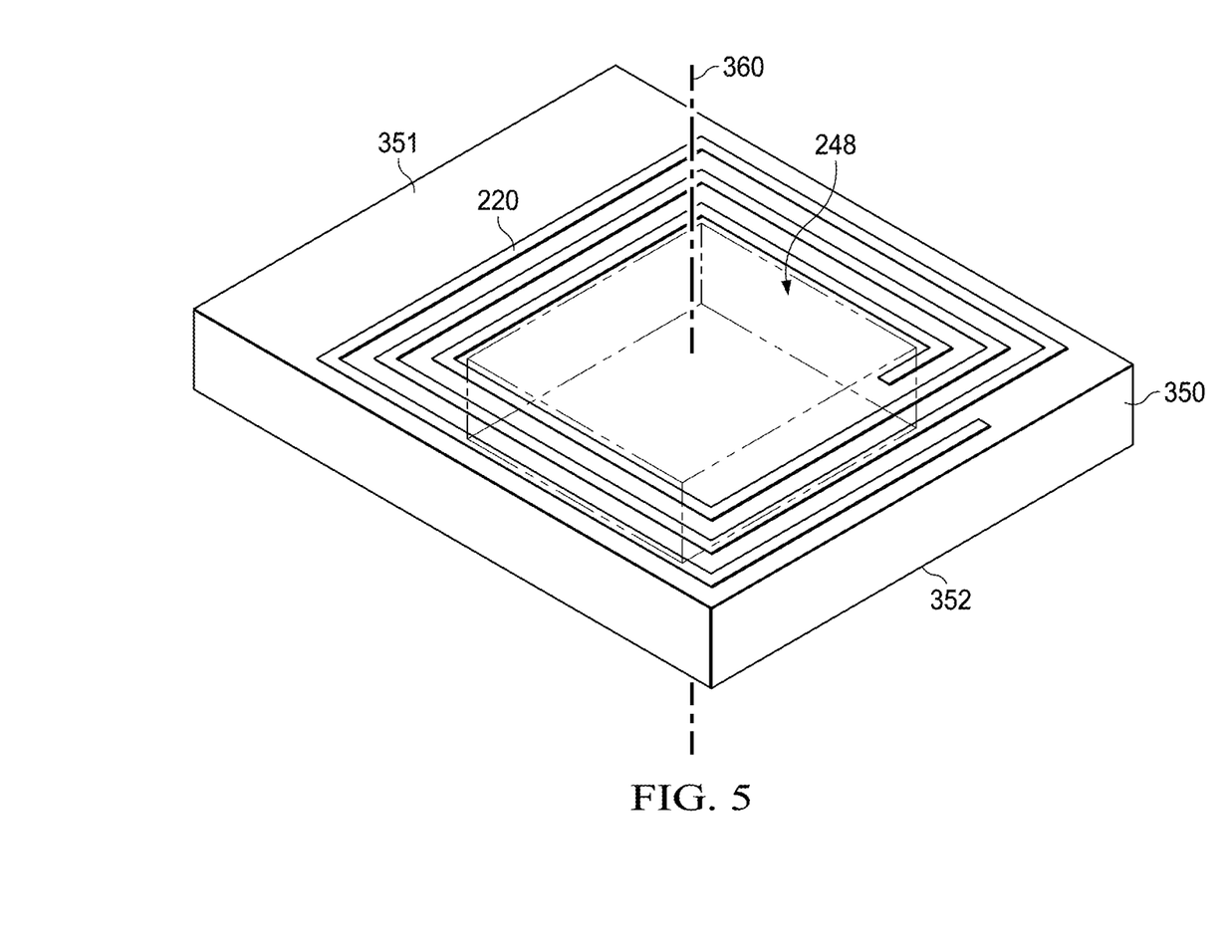
FIG. 5 shows a view of one surface of the material discernment sensor including an antenna coil in accordance with various embodiments.
Figure 6:
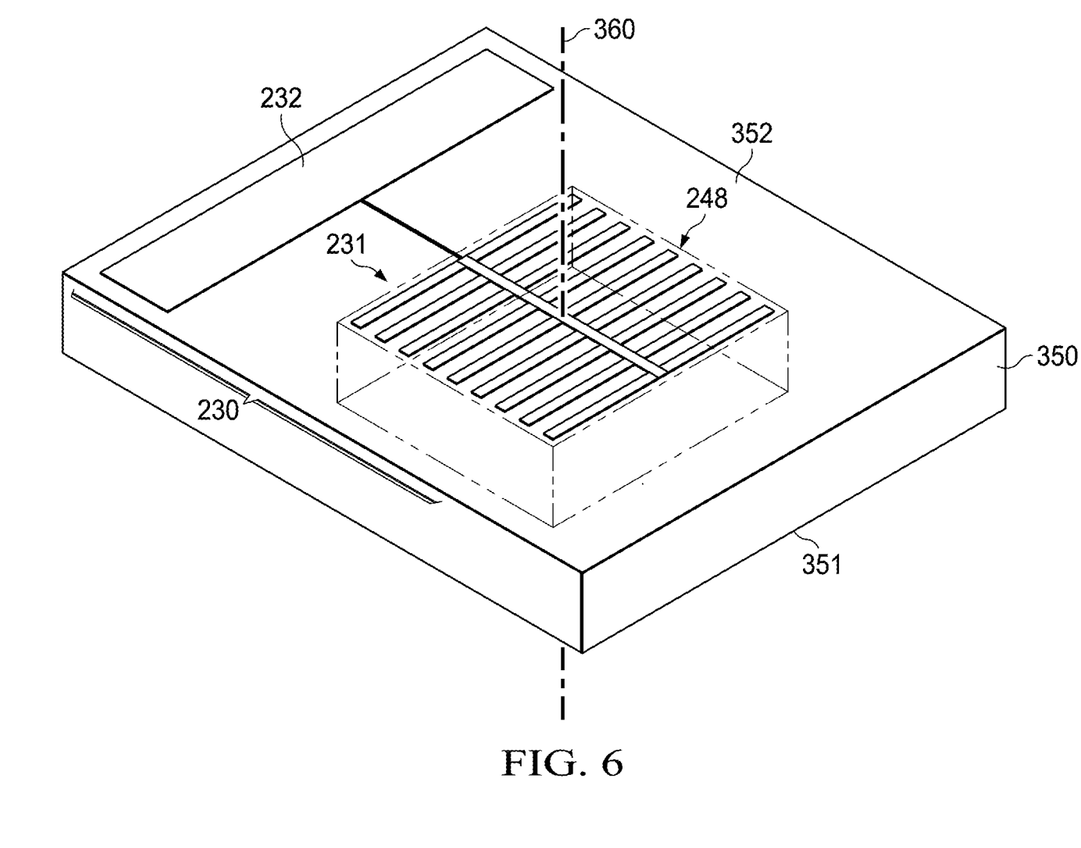
FIG. 6 shows a view of an opposing surface of the material discernment sensor including a capacitive sensor in accordance with various embodiments.

FIGS. 4-6 illustrate an embodiment of at least a portion of the material discernment proximity sensor 134. FIG. 4 shows a cross-sectional side view while FIGS. 5 and 6 illustrate perspective views. Referring first to FIG. 4, the sensor 134 comprises a dielectric structure 350 including first and second opposing surfaces 351 and 352. The dielectric structure may comprise Polymide or other suitable material. In the embodiment of FIGS. 4-6, the antenna coil is formed on surface 351 and the capacitive sensor 230 is formed on the opposing surface 352. The conductive pattern 231 is shown on side 352 spaced apart from the conductive bar 234. In some embodiments, the antenna coil 220 and the capacitive proximity sensor 220 may comprise flexible conductive tape. The thickness of the dielectric material is represented as D4, and thus the separation between the antenna coil 220 and the capacitive proximity sensor 230 also is substantially equal to D4 in this example.

FIG. 5 illustrates a perspective view showing the antenna coil 220 formed on surface 351 of the dielectric structure 350. An axis 360 is shown orthogonal to the plane defined by surface 351. The axis 360 is also shown in FIG. 4. The antenna coil 220 of FIG. 5 is formed on surface 351 and thus defines a plane passing through the antenna coil that is the same plane as that defined by surface 351. Similarly, the capacitive proximity sensor 230 shown in FIG. 6 is formed on surface 352 and thus defines a plane passing through the proximity sensor 230 that is the same plane as that defined by surface 352. The two planes defined by the antenna coil 220 and capacitive proximity sensor 230 are parallel to each other and axially spaced apart from each other by distance D4. The conductive pattern 231 is within the interior region 248 of the antenna coil 220 as the interior region 248 is projected on to opposing surface 351 as best illustrated in FIGS. 5 and 6.

Figure 7:
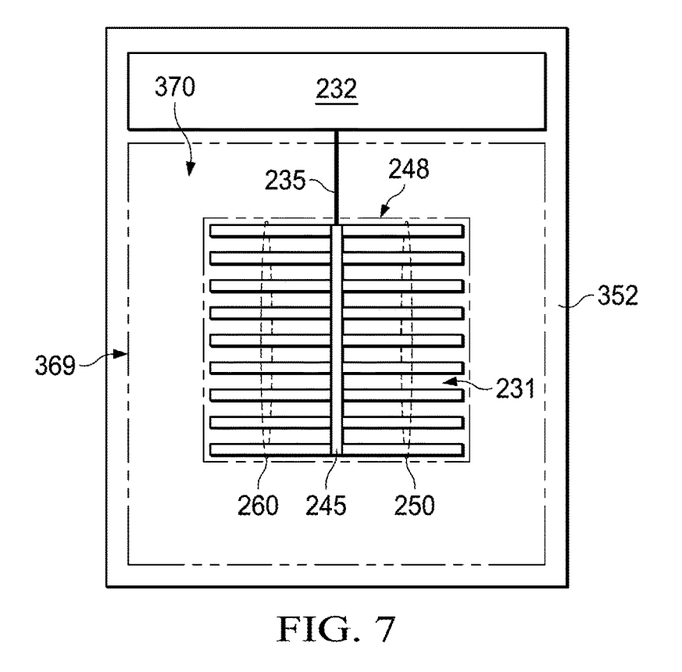
FIG. 7 illustrates a conductive pattern forming the capacitive sensor in accordance with various embodiments.

FIG. 7 illustrates a view of surface 352 of the capacitive proximity sensor 230. This view shows the conductive pattern 231 coupled to the conductive bar 232 by the conductive connection 235. The figure shows two dashed boxes—an inner dashed box and an outer dashed box 369. The inner dashed box represents the projection from opposing surface 351 of the interior region 248 of the antenna coil 220 that is devoid of any of the antenna coils. The outer dashed box 369 represents a projection from opposing surface 351 of the outer periphery of the antenna coil 220. The antenna coil 220 itself is thus provided into the space 370 on surface 351 between the two dashed boxes. As can be seen in the example of FIG. 7, the parallel conductors 250 and 260 extend away from conductive longitudinal portion 245 but do not cross dashed box representing the projection of interior region 248. As such, the parallel conductors 250 and 260 do not overlap the antenna coil 220 which is provided in space 370.

Figure 8:
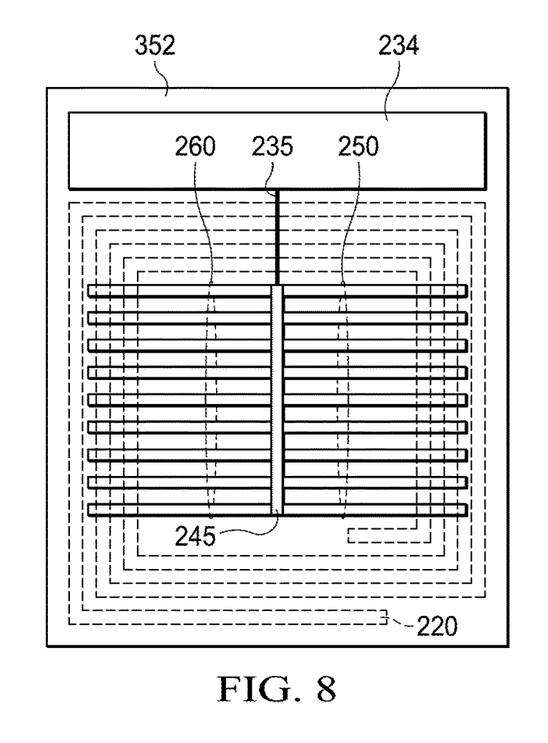
FIG. 8 illustrates a conductive pattern forming the capacitive sensor in accordance with another embodiment.
Figure 9:
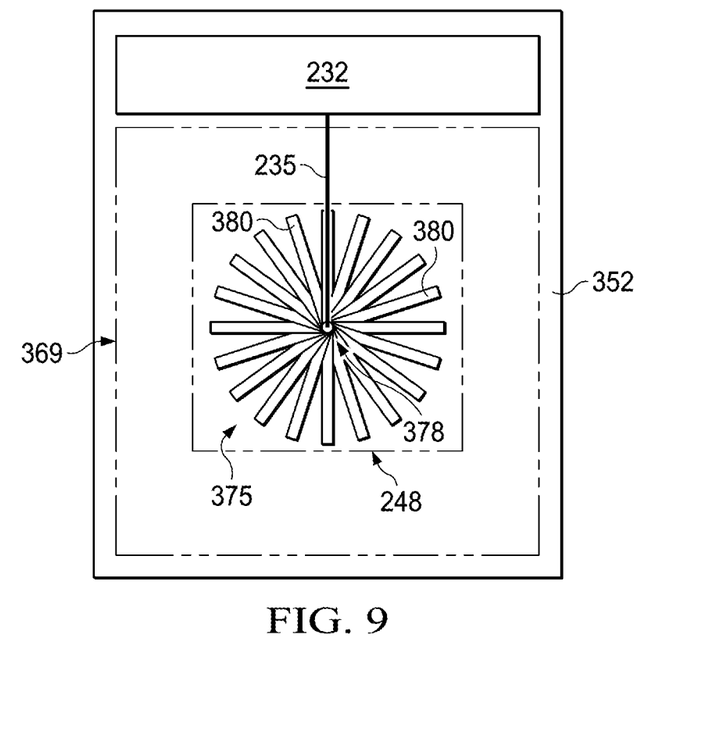
FIG. 9 illustrates a conductive pattern forming the capacitive sensor in accordance with yet another embodiment.

FIG. 8 shows an alternative embodiment to that of FIG. 7. In FIG. 8 the parallel conductors 250, 260 extend far away enough from conductive longitudinal portion 245 so as to extend into the space 270 (not specifically designated in FIG. 8) in which the antenna coil 220 is contained (antenna coil 220 is shown in dashed line). In this embodiment, the parallel conductors 250, 260 overlap one or more loops of the antenna coil 220. Because the parallel conductors 250, 260 are provided on a plane axially spaced along axis 360 from the plane defined by the antenna coil 220, the antenna coil 220 is not in electrical contact with the parallel conductors of the conductive pattern of the capacitive proximity sensor 230. In the embodiment of FIG. 9, at least a portion of each of the plurality of conductors on surface 352 crosses at least one of the conductive loops of the antenna coil 220 when such loops are projected on to surface 352.

FIG. 9 shows an alternative embodiment to conductive pattern 231. In FIG. 9, an alternative conductive pattern 375 is shown as implemented as part of the capacitive proximity sensor. The conductive pattern 375 includes a central conductive portion 378 from which a plurality of conductors 380 radiate outward to form a star pattern. The central conductive portion 378 may be generally circular in some embodiments. The conductors 380 in this embodiment are not parallel to each other and extend away from the central portion 378 at various angles as shown. Any number of conductors 380 can be included and such conductors extend away from the central conductive portion 378 in at least three different directions.

In the above embodiments, the conductive pattern of the capacitive proximity sensor 230 is spaced apart from the antenna coil 220 on opposing surfaces of a dielectric structure. In other embodiments, the conductive pattern (231, 375) may formed in the same plane as that defined by the antenna coil 220. In such embodiments, the conductive pattern is axially aligned with the antenna coil with respect to axis 360. Further, the conductive bar also may be in the same plane as the conductive pattern and the antenna coil 220. The conductive connection 235 electrically connecting the conductive pattern to the conductive bar 234 may be formed as a conductive trace in a different layer (e.g., on an opposing surface of the dielectric structure) and connected to the respective conductive bar and conductive pattern using vias filled with conductive material.

Figure 10:
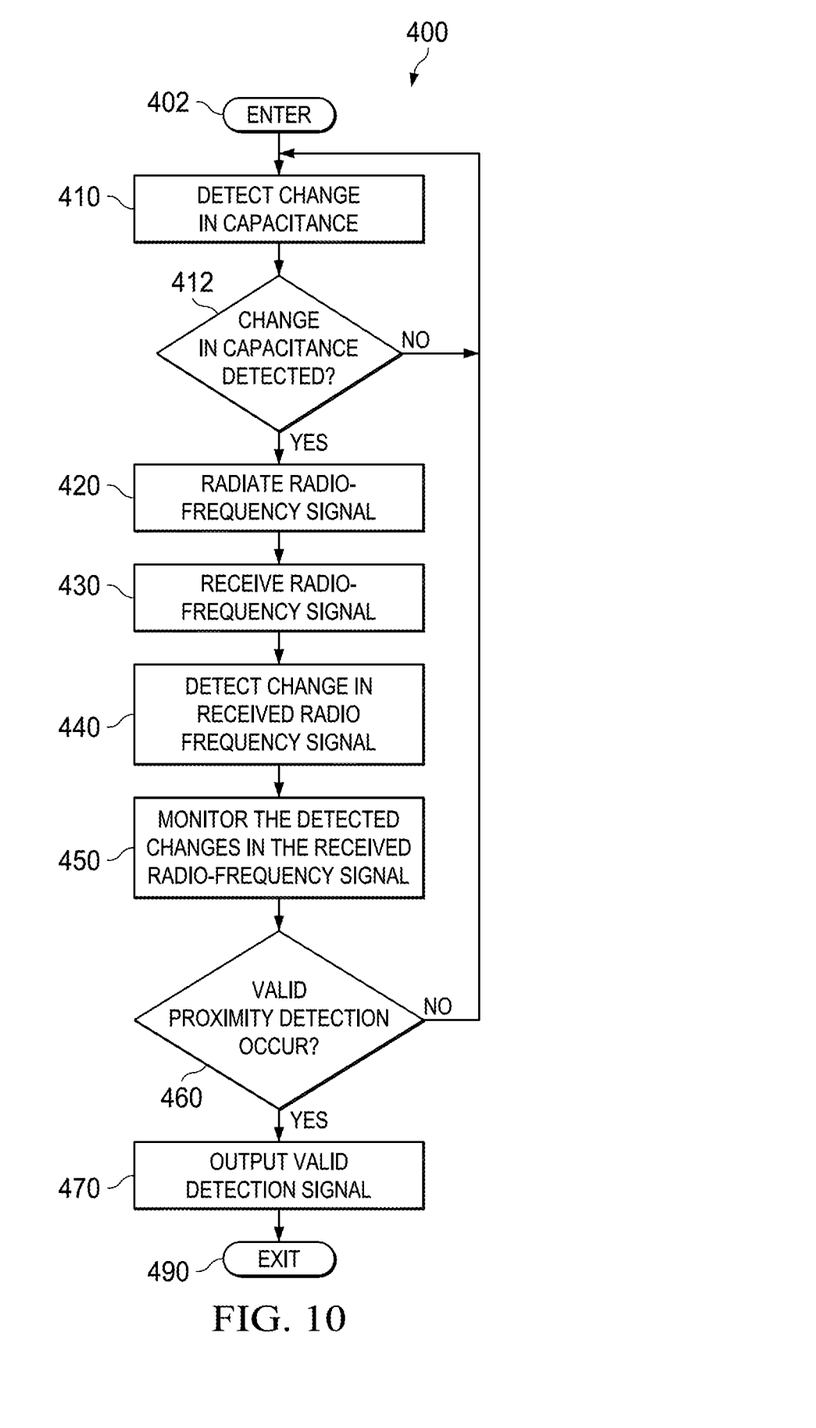
FIG. 10 is a flow diagram illustrating material-discerning proximity sensing in accordance with embodiments of the disclosure.

FIG. 10 is a flow diagram illustrating a material-discerning proximity sensing in accordance with embodiments of the disclosure. The program flow illustrated herein is exemplary, and thus various operations within the program flow can be performed in an order that is not necessarily the same as the program flow illustrated herein. The illustrative operations shown in FIG. 4 may be performed in the order shown or in a different order. Further, two or more of the operations may be performed in parallel rather than sequentially.

In operation 410, a change in the capacitance of the capacitive sensor is detected. The capacitive change is detected using any suitable method including, for example, measuring an RC time-constant that is associated with the capacitive sensor. As discussed above, the change in capacitance can detect the proximity of an object, but may be insufficient to discern the material that comprises the object.

In operation 412, a determination is made whether a change in capacitance has been detected. A change in capacitance may indicate the presence of a proximate object with the range of the sensor 134. If a change in capacitance has not occurred, program flow proceeds to operation 410. If a change in capacitance has occurred, program flow proceeds to operation 420.

In operation 420, a radio-frequency signal is radiated by an antenna that is substantially arranged around a capacitive sensor. The antenna is substantially arranged around the capacitive sensor when the radiated radio-frequency signal induces a voltage in the capacitive sensor. Program flow proceeds to operation 420.

In operation 430, the capacitive sensor receives the radiated radio-frequency signal. A baseline measurement (such as when there is no object in the proximity of the capacitive sensor) of the magnitude of the received radio-frequency signal. The baseline measurement can be made by under-sampling (e.g., below Nyquist rates) the received radio-frequency signal using an ADC as described above to detect an energy level of the received radio-frequency signal received over a selected time period. The under-sampling also increases the relative amount of noise immunity of the system used to perform the material-discerning proximity sensing. The noise is typically generated externally to the system, although noise generated by the system is also possible. Program flow proceeds to operation 440.

In operation 440, a change in the received radio-frequency signal is detected. The change in the received radio-frequency signal is detected by measuring the magnitude of the received radio-frequency signal (using the under-sampling ADC, for example). Program flow proceeds to operation 450.

In operation 450, the detected changes in the received radio-frequency signal are monitored. The detected changes in the received radio-frequency signal are monitored by comparing the measured magnitude with the baseline measurement to determine the degree of the detected change. The change in the received radio-frequency signal can also be detected by measuring the magnitude of the received radio-frequency signal and comparing the measured magnitude with a predetermined threshold to determine the degree of detected change. The change in the received radio-frequency signal can also be detected by measuring the magnitude of the received radio-frequency signal and comparing the measured magnitude with a list of one or more thresholds that compare with predetermined thresholds that each correspond to a type of material of an object (such as a human finger) that would be used to make a valid proximity detection. Program flow proceeds to operation 460.

In operation 460, a determination is made whether a valid proximity detection has occurred. Comparison of the measured magnitude of the received radio-frequency signal with the predetermined thresholds provides an indication of the material that comprises a proximal object (e.g., that causes the detected change in capacitance). The measured magnitude is in direct proportion to the conductivity of the proximal object. Thus, discernment of a characteristic of the material that comprises the proximal object increases the likelihood of a valid detection. If a valid proximity detection has not occurred, program flow proceeds to operation 430. If a valid proximity detection has occurred, program flow proceeds to operation 470.

In operation 470, a valid detection signal is output. The valid detection signal is output in response to the determination of a valid detection. The output valid detection signal is used by a processing system to perform an action in response to the valid detection of a proximate object (detected in response to a press of a human finger, for example). The action performed can be any action performable by a system such as accepting a security code, selection of an elevator control, dispensing a selected product from a machine, and the like. Program flow proceeds to node 490 and terminates.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device comprising:
 a conductive loop that surrounds an interior region;
 a capacitive sensor that includes a first portion disposed within the interior region and a second portion disposed such that a portion of the conductive loop is between the first portion of the capacitive sensor and the second portion of the capacitive sensor; and
 a control circuit coupled to the conductive loop and to the capacitive sensor, wherein the control circuit is configured to:
  cause the conductive loop to radiate a first signal;
  receive a second signal from the capacitive sensor in response to the first signal; and
  detect a change in a characteristic of the second signal.

2. The device of claim 1, wherein the control circuit is configured to:
 measure a capacitance of the capacitive sensor;
 detect proximity of an object based on the capacitance of the capacitive sensor; and
 determine a type of material of the object based on the change in the characteristic of the second signal.

3. The device of claim 2, wherein the control circuit is configured to:
 determine a baseline for the characteristic of the second signal based on the second signal in response to the first signal when the object is not in proximity to the capacitive sensor; and
 in response to the detection of the proximity of the object based on the capacitance of the capacitive sensor, detect the change in the characteristic by comparing the second signal in response to the first signal when the object is in proximity to the capacitive sensor to the baseline.

4. The device of claim 1, wherein the first signal is a radio frequency signal.

5. The device of claim 1, wherein the conductive loop is a rectilinear loop.

6. The device of claim 1, wherein the conductive loop includes a plurality of linear conductors disposed in a rectilinear spiral around the interior region.

7. The device of claim 1, wherein the first portion of the capacitive sensor includes a plurality of conductor segments extending radially from a center point.

8. The device of claim 7, wherein each of the plurality of conductor segments has a substantially same length.

9. The device of claim 1, wherein the first portion of the capacitive sensor includes a center conductive feature and a plurality of conductive features extending from the center conductive feature.

10. The device of claim 9, wherein:
 the center conductive feature extends in a first direction; and
 each of the plurality of conductive features extends away from the center conductive feature in a second direction that is perpendicular to the first direction.

11. The device of claim 9, wherein each of the plurality of conductive features has a first width and the plurality of conductive features are spaced apart from one another by a distance that is substantially the same as the first width.

12. The device of claim 1, wherein:
 the conductive loop has a first width in a first direction; and
 the second portion of the capacitive sensor includes a conductive plate having the first width in the first direction.

13. A device comprising:
 an antenna that includes a set of linear conductors arranged in a rectilinear spiral around an interior region and bounded by an exterior region;
 a capacitive sensor that includes a first portion disposed below the interior region and a second portion disposed below the exterior region; and
 a control circuit coupled to the antenna and to the capacitive sensor, wherein the control circuit is configured to:
  cause the antenna to radiate a first signal;
  receive a second signal from the capacitive sensor in response to the first signal; and
  detect a change in a characteristic of the second signal.

14. The device of claim 13, wherein the control circuit is configured to:
 measure a capacitance of the capacitive sensor;
 detect proximity of an object based on the capacitance of the capacitive sensor; and
 determine a type of material of the object based on the change in the characteristic of the second signal.

15. The device of claim 14, wherein the control circuit is configured to, in response to the detection of the proximity of the object based on the capacitance of the capacitive sensor:
 cause the antenna to radiate the first signal; and
 receive the second signal from the capacitive sensor in response to the first signal.

16. The device of claim 13, wherein the first portion of the capacitive sensor includes a plurality of conductor segments extending radially from a center point.

17. The device of claim 13, wherein the first portion of the capacitive sensor includes a center conductive feature and a plurality of conductive features extending from the center conductive feature.

18. The device of claim 17, wherein:
the center conductive feature extends in a first direction; and
each of the plurality of conductive features extends away from the center conductive feature in a second direction that is perpendicular to the first direction.

19. The device of claim 17, wherein each of the plurality of conductive features has a first width and the plurality of conductive features are spaced apart from one another by a distance that is substantially the same as the first width.

20. The device of claim 13, wherein:
the antenna has a first width in a first direction; and
the second portion of the capacitive sensor includes a conductive plate having the first width in the first direction.

* * * * *